United States Patent
Freuler et al.

[11] Patent Number: 5,904,796
[45] Date of Patent: May 18, 1999

[54] ADHESIVE THERMAL INTERFACE AND METHOD OF MAKING THE SAME

[75] Inventors: Raymond G. Freuler, Laguna Hills; Gary E. Flynn, Dana Point, both of Calif.

[73] Assignee: Power Devices, Inc., Laguna Hills, Calif.

[21] Appl. No.: 08/760,468

[22] Filed: Dec. 5, 1996

[51] Int. Cl.⁶ .................................................. B32B 31/00
[52] U.S. Cl. .......................................... 156/278; 156/289
[58] Field of Search .............................. 29/840; 156/278, 156/280, 289, 324

[56] References Cited

U.S. PATENT DOCUMENTS

| | | | |
|---|---|---|---|
| 2,799,793 | 7/1957 | De Cain | 313/312 |
| 3,013,104 | 12/1961 | Young | 174/52 |
| 3,249,680 | 5/1966 | Sheets et al. | 174/15 |
| 3,356,828 | 12/1967 | Furness | 219/365 |
| 3,391,242 | 7/1968 | Sudges | 174/15 |
| 3,463,140 | 8/1969 | Rollor, Jr. | 126/246 |
| 3,463,161 | 8/1969 | Andrassy | 128/402 |
| 3,467,547 | 9/1969 | Harvey et al. | 117/158 |
| 3,476,177 | 11/1969 | Potzl | 165/80 |
| 3,586,102 | 6/1971 | Gilles | 162/186 |
| 3,603,106 | 9/1971 | Ryan | 62/457 |
| 3,819,530 | 6/1974 | Ratledge et al. | 252/311.5 |
| 3,823,089 | 7/1974 | Ryan et al. | 252/70 |
| 3,887,628 | 6/1975 | Beckers | 260/652.5 R |
| 3,972,821 | 8/1976 | Weidenbenner et al. | 252/75 |
| 4,065,908 | 1/1978 | Mueller | 53/15 |
| 4,139,051 | 2/1979 | Jones et al. | 165/1 |
| 4,151,547 | 4/1979 | Rhoades et al. | 357/81 |
| 4,237,086 | 12/1980 | Gehle | 264/130 |
| 4,266,267 | 5/1981 | Ruegg | 361/386 |
| 4,299,715 | 11/1981 | Whitfield et al. | 252/74 |
| 4,466,483 | 8/1984 | Whitfield et al. | 165/185 |
| 4,473,113 | 9/1984 | Whitfield et al. | 165/185 |
| 4,489,487 | 12/1984 | Bura | 29/840 |
| 5,237,086 | 8/1993 | Kruger et al. | 558/271 |

FOREIGN PATENT DOCUMENTS

| | | |
|---|---|---|
| 600823 | 6/1960 | Canada . |
| 2368529 | 5/1978 | France . |
| 1086003 | 10/1967 | United Kingdom . |

OTHER PUBLICATIONS

Power Devices, Inc.; Adhesive–Backed Aluminum Substrate with High Performance Thermal Compound in Easy–To–Use Form; 2 pgs., 1996.

Power Devices, Inc.; Kapton MT Substrate Coated with High Performance Thermal Compound in Easy–To–Use Form; 2 pgs., 1996.

Power Devices, Inc.; Low Mounting Pressure High Thermal Conductivity; 2 pgs.

Crayotherm Corporation; Crayotherm Offers the Equations for Your Product Reliability!; 4 pgs., Mar. 1985.

Power Devices, Inc.; High Efficiency Thermal Interface Pads; 8 pgs., Sep. 1991.

*Primary Examiner*—Francis J. Lorin
*Attorney, Agent, or Firm*—Stetina Brunda Garred & Brucker

[57] ABSTRACT

A thermal interface facilitates heat transfer from an electronic component to a heat sink. The thermal interface has a generally planar substrate formed of a heat resistant material having a layer of adhesive formed upon one surface thereof. A layer of conformable, heat conducting material is formed upon the other surface of the substrate. The other layer of adhesive facilitates attachment of the thermal interface to either an electronic component or a heat sink, as desired. The layer of conformable heat conducting material deforms so as to enhance heat transfer from the electronic component to the heat sink.

10 Claims, 3 Drawing Sheets

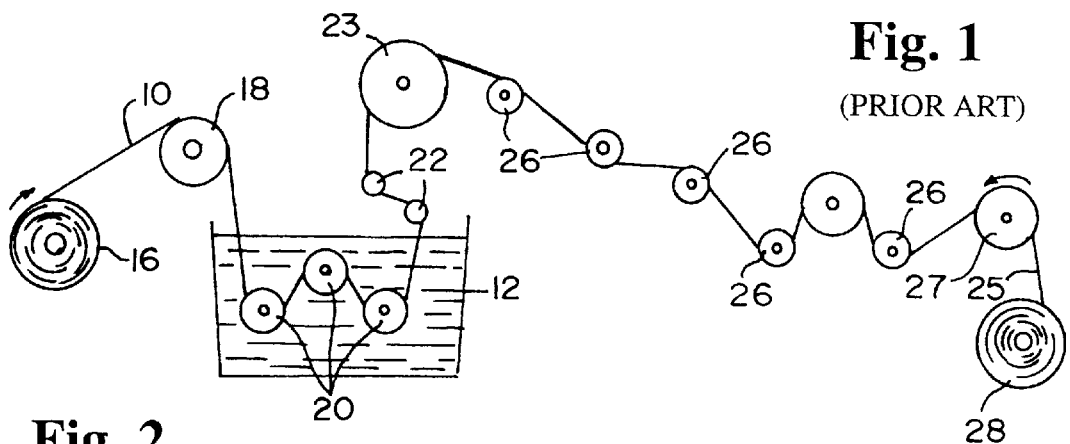
Fig. 1 (PRIOR ART)
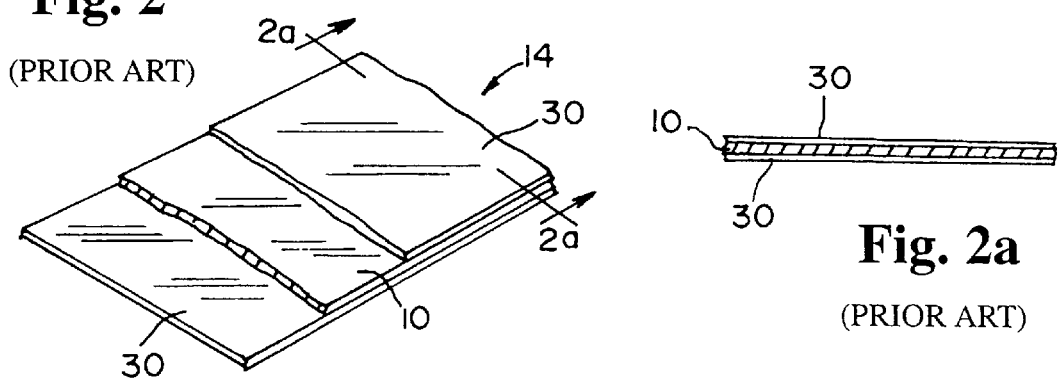
Fig. 2 (PRIOR ART)
Fig. 2a (PRIOR ART)
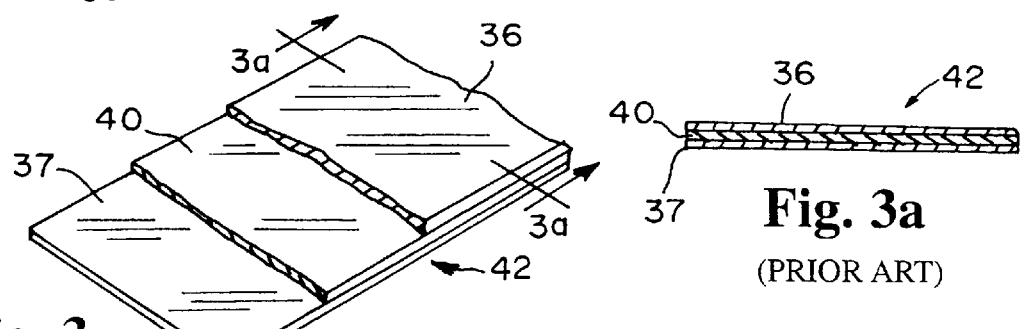
Fig. 3 (PRIOR ART)
Fig. 3a (PRIOR ART)
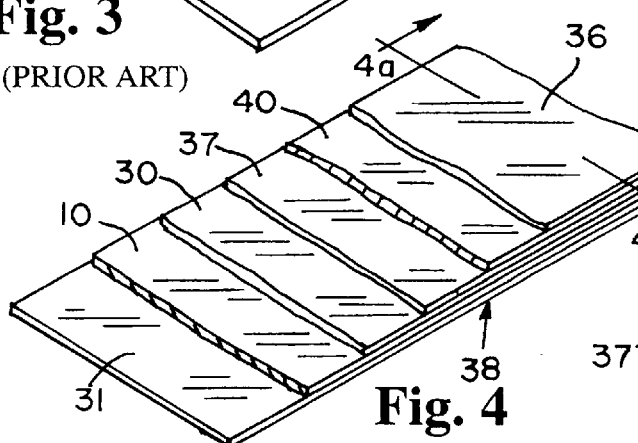
Fig. 4 (PRIOR ART)
Fig. 4a (PRIOR ART)

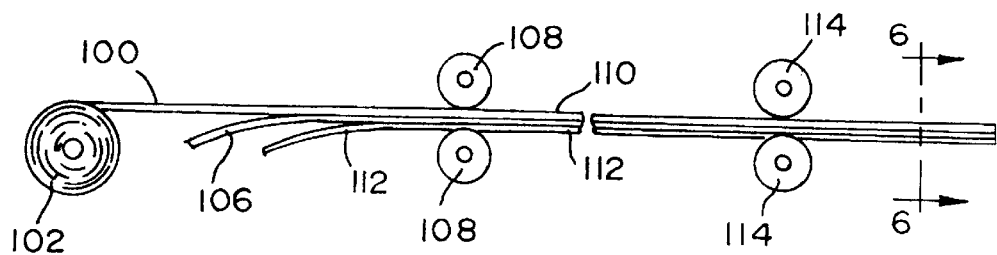
Fig. 5
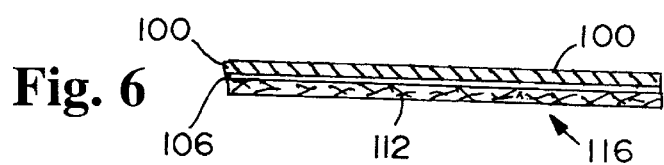
Fig. 6
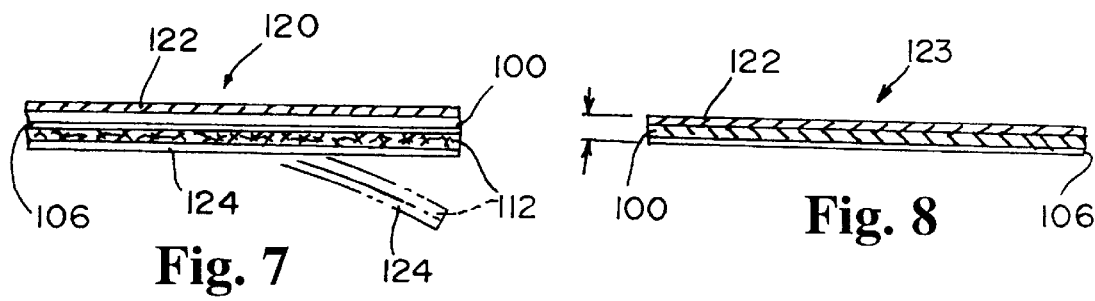
Fig. 7  Fig. 8
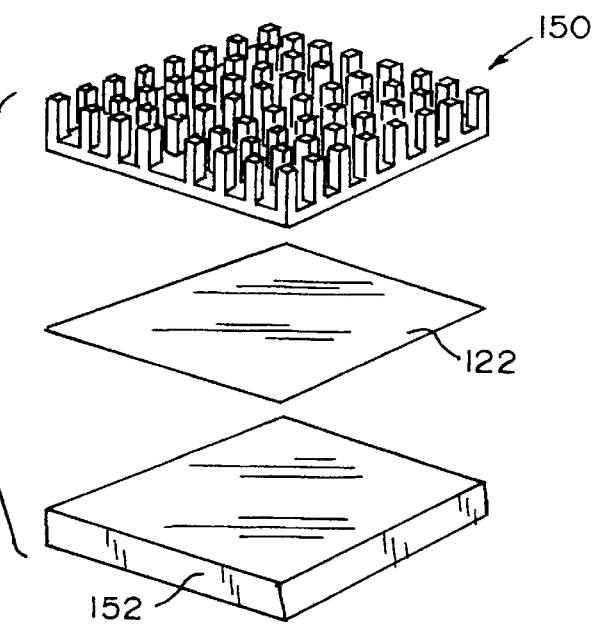
Fig. 9

ADHESIVE THERMAL INTERFACE AND METHOD OF MAKING THE SAME

FIELD OF THE INVENTION

The present invention generally relates to heat transfer devices and more particularly to a thermal interface for facilitating heat transfer from an electronic component to a heat sink so as to provide cooling for the electronic component to insure reliable and long-lived operation thereof.

BACKGROUND OF THE INVENTION

The need for enhancing heat dissipation from some electronic components is well appreciated. Various electronic components, typically semiconductor devices, generate sufficient heat to adversely affect the operation thereof, if adequate heat dissipation is not provided. For example, power transistors and high performance CPUs typically generate enough heat to cause permanent damage to themselves.

According to contemporary methodology, the typical solution to such heat dissipation problems is to provide an external heat dissipator or heat sink to the electronic device. Such a heat sink ideally provides a heat-conductive path away from the electronic component to fins or other protuberances having sufficient surface area to dissipate the heat to the surrounding air. A fan is frequently used to assure adequate air circulation over the protuberances, so as to maintain desirable heat dissipation therefrom.

However, a common problem is that the surfaces of the electronic component and the heat sink, at the interface thereof, tend to be sufficiently irregular as to impede heat flow across the interface. The irregularity of the surfaces of the electronic component and heat sink at the interface thereof create air gaps or voids which reduce heat flow across the interface. As those skilled in the art will appreciate, heat flow across the interface improves substantially with better mechanical contact between the electronic component and the heat sink.

Although it is possible to machine the surfaces of the electronic component and heat sink at the interface thereof in order to improve the mechanical contact therebetween, it has been found to be prohibitively expensive to do so. Alternatively, contemporary methodology dictates that a viscous, heat conductive compound, typically silicone grease, be applied at the interface of the electronic component and the heat sink so as to fill voids formed therein. Thus, a substantially more complete and efficient heat path is provided from the electronic component to the heat sink.

However, as those skilled in the art will appreciate, the use of a silicone grease has inherent disadvantages. Silicone grease is inherently messy and tends to soil personnel, clothing, and equipment, as well as nearby electronic components. Silicone grease is difficult to effectively clean, particularly from electronic assemblies.

Further, such use of silicone grease entails properly metering and applying the same to the desired electronic components and/or heat sinks in order to be effectively and economically utilized. The metering and application of silicone grease is inherently difficult and time consuming. Costly machinery is required to automate the process.

Further, silicone based thermal greases inherently migrate, over time, away from surfaces upon which they are initially applied. This migration of silicone based thermal greases facilitates the formation of air gaps or voids at the thermal interface. As those skilled in the art will appreciate, such air gaps or voids substantially reduce heat transfer across the thermal interface.

In an attempt to overcome the well known deficiencies of silicone grease, various heat conductive pads have been developed. Such heat conductive pads are typically preformed to have a shape or footprint compatible with a particular electronic component and/or heat sink, such that they may easily be applied thereto prior to attaching the heat sink to the electronic component.

Two examples of such contemporary pad-type thermal interfaces are THERMSTRATE and ISOSTRATE (both registered trademarks of Power Devices, Inc. of Laguna Hills, Calif.).

The THERMSTRATE interface comprises thermally conductive, die-cut pads which are placed intermediate the electronic component and heat sink so as to enhance heat conduction therebetween. The THERMSTRATE heat pads comprise a durable, type 1100 aluminum alloy substrate having a thickness of 0.002 inch and are coated on both sides with a proprietary thermal compound. The thermal compound comprises a paraffin base containing additives which enhance the thermal conductivity thereof. Additives also control the response of the thermal compound to heat and pressure. THERMSTRATE is dry on assembly, i.e., at room temperature, yet provides excellent wetting at the operating temperature of the electronic component to which it is applied, so as to assure desired heat conduction.

The ISOSTRATE thermal interface is likewise a die-cut mounting pad and utilizes a heat conducting polyamide substrate, i.e., KAPTON (a registered trademark of DuPont) Type MT. The ISOSTRATE thermal interface likewise has a propriety paraffin based thermal compound utilizing additives to enhance thermal conductivity and to control its response to heat and pressure.

Both THERMSTRATE and ISOSTRATE thermally conductive heat pads are silicone free and provide a no-mess, no-waste permanent replacement for thermal grease and the like. Such thermally conductive pads eliminate the problems and expense of handling and soiling which are commonly associated with the use of silicone grease.

The process for forming thermal interfaces according to contemporary methodology is described in more detail in U.S. Pat. No. 4,299,715 issued on Nov. 10, 1981 to Whitfield, et al. and entitled METHODS AND MATERIALS FOR CONDUCTING HEAT FROM ELECTRONIC COMPONENTS AND THE LIKE; U.S. Pat. No. 4,466,483 issued on Aug. 21, 1984 to Whitfield, et al. and entitled METHODS AND MEANS FOR CONDUCTING HEAT FROM ELECTRONIC COMPONENTS AND THE LIKE; and U.S. Pat. No. 4,473,113 issued on Sep. 25, 1984 to Whitfield, et al. and entitled METHODS AND MATERIALS FOR CONDUCTING HEAT FROM ELECTRONIC COMPONENTS AND THE LIKE, the contents of all three of which are hereby incorporated by reference.

However, to date, no pad thermal interface is known which provides adequate heat dissipation, is inexpensive to manufacture, and which utilizes an adhesive to attach the pad to either the electronic component or the heat sink.

The prior art practice of adhesively bonding the thermal interface to either the electronic component or the heat sink is well known. Such practice facilitates handling of the interface and also allows the heat conductive interface to be sold along with either the electronic component or the heat sink already in place thereon.

Generally, according to contemporary practice, the use of an adhesive material to attach the heat conductive interface to either the electronic component or the heat sink is thought to be undesirable. It is thought that the addition of such an adhesive layer to the interface would undesirably reduce heat conduction from the electronic component to the heat sink. This is particularly true since, according to contemporary methodology, the addition of an adhesive layer entails the addition of a substrate and the addition of a second adhesive layer.

For example, one prior art attempt to utilize adhesive to attach a pad thermal interface to either an electronic component or heat sink involves the fabrication of a pad having six layers, as discussed in detail below. As those skilled in the art will appreciate, heat flow is substantially reduced by such additional layers.

Not only does each individual layer impede heat flow, but, as those skilled in the art will appreciate, each interface of different adjacent layers additionally inhibits heat flow. Thus, each layer contributes three distinct impediments to heat flow. It introduces the material of which the layer itself is comprised, as well as the two interfaces at either surface of the layer. Thus, it will be appreciated that it is highly desirable to minimize the number of layers, and consequently the number of interfaces.

It has been found that the use of a thermal interface having six layers does not provide desirable heat transfer from the electronic component to the heat sink. Such a six layer pad is also expensive to manufacture. Thus, it is desirable to minimize the number of layers defining the thermal interface.

As is typical for attaching a heat sink to an electronic component, clips, clamps, fasteners, or other devices may be utilized so as to further assure adequate contact of the heat sink and electronic device at the interface thereof, and also so as to assure that the heat sink remains reliably attached to the electronic component. This is of particular concern since different adhesives have different curing rates and bonding strengths.

As such, it is beneficial to provide a thermal interface pad which is adhesively bondable to either the electronic component or the heat sink, which does not substantially reduce heat flow from the electronic component to the heat sink, and which does not substantially increase the manufacturing cost thereof as compared to contemporary thermal interfaces pads.

SUMMARY OF THE INVENTION

The present invention specifically addresses and alleviates the above-mentioned deficiencies associated with the prior art. More particularly, the present invention comprises a thermal interface for facilitating heat transfer from an electronic component to a heat sink. The thermal interface of the present invention is utilized along with contemporary mechanical attachment means, i.e., clips, clamps, etc., so as to optimize both thermal performance and structural integrity. The thermal interface consists essentially of a generally planar substrate comprised of durable heat conductive material. A layer of malleable or conformable, heat conducting material is formed upon a first surface of the substrate. A layer of adhesive is formed upon the second surface of the substrate to facilitate attachment of the thermal interface of the present invention to either the electronic component or the heat sink, preferably the heat sink.

The substrate preferably comprises a polymer, preferably KAPTON Type MT. Alternatively, the substrate comprises a metal, preferably an aluminum alloy, preferably Type 1100 aluminum alloy, or oxygen free soft copper foil.

The layer of conformable heat-conducting material conforms to the surfaces of the electronic component and the heat sink so as to enhance heat transfer from the electronic component to the heat sink. The layer of conformable heat conducting material preferably comprises paraffin or a mixture of paraffin with petroleum jelly or the like. As those skilled in the art will appreciate, various other viscous heat conductive materials, such as synthetic fatty acid compounds including castor oils, are likewise suitable.

The heat conducting material preferably further comprises an additive which enhances the heat conduction thereof. The additive preferably comprises a metallic powder having high thermal conductivity, such as a powder of zinc oxide, boron nitride and/or aluminum oxide.

The layer of conformable heat conducting material is preferably generally solid at room temperature and generally fluid at an operational temperature of the electronic component. Thus, a generally solid or dry-to-the-touch thermally conductive material is provided at room temperature to facilitate application thereof and prevent the soiling commonly associated with the use of silicone grease. This substantially reduces assembly time and costs, and also increases the reliability of the electronic component from which heat being dissipated.

The reliability of the electronic component from which heat is being dissipated is enhanced since an adequate thermal interface is assured. At the operating temperature of the electronic component, the heat conducting material flows so as to assure that voids formed at the interface of the electronic component and the heat sink are filled therewith, thereby enhancing heat flow.

According to the preferred embodiment of the present invention, a peel away protective layer is applied to the layer of adhesive on the second surface of the substrate. The peel away protective layer preferably comprises paper. Peeling away the protective layer exposes the layer of adhesive on the second surface of the substrate so as to facilitate adhesive bonding of the thermal interface to either the electronic component or the heat sink, preferably the heat sink. Thus, the integrity of the adhesive surface utilized to attach the thermal interface to either the electronic component or the heat sink is maintained during handling and storage thereof. An unprotected adhesive layer would quickly become contaminated or soiled and thus lose its adhesive properties if not so protected.

Those skilled in the art will appreciate that various means for applying the adhesive thermal interface of the present invention are suitable.

The method for forming the thermal interface of the present invention preferably comprises the steps of forming a layer of adhesive upon the second surface of a generally planar substrate. The substrate is comprised of a heat conductive material such as an aluminum foil or a polymer film, as discussed above. Next, a layer of conformable heat conducting material is formed upon the first surface of the substrate.

Preferably, the layer of conformable heat conducting material is formed upon the first side of the substrate by immersing the substrate in a bath of liquid thermally conductive material after applying a peel away protective layer to the second side of the substrate having the adhesive formed thereon. This process generally additionally results in the formation of a layer of conformable heat conducting material upon the peel away protective layer. While this is generally of little consequence, those skilled in the art will appreciate that various apparatus and methodologies may be utilized to eliminate or minimize such coating of the peel away protective layer, if desired.

Thus, the resulting adhesive thermal interface of the present invention comprises four layers prior to use thereof (not counting any of the conformable heat conducting material remaining upon the peel away protective layer). When in use, i.e., after the peel away protective layer has been removed, the adhesive thermal interface of the present invention comprises three layers, i.e., the substrate, the heat conducting material formed upon the first side of the substrate, and the adhesive formed upon the second side of the substrate.

Thus, as those skilled in the art will appreciate, a minimal number of layers is utilized according to the present invention to attain the desirable benefits of good heat conduction and ease of use.

These, as well as other advantages of the present invention will become more apparent from the following description and drawings. It is understood that changes in the specific structure shown and described may be made within the scope of claims without departing from the spirit of the invention.

BRIEF DESCRIPTION OF THE DRAWINGS

FIG. 1 is a schematic side view of a prior art process for applying thermally conductive material to both sides of a substrate;

FIG. 2 is a perspective view of a substrate having thermally conductive material formed upon both sides thereof according to the prior art, as results from the process of FIG. 1;

FIG. 2a is a cross-sectional end view of the prior art substrate and thermally conductive layers of FIG. 2, taken along lines 2a thereof;

FIG. 3 is a perspective view of a prior art substrate having adhesive layers formed upon either surface thereof;

FIG. 3a is a cross-sectional end view of the prior art substrate and adhesive layers of FIG. 3, taken along lines 3a thereof;

FIG. 4 is a perspective view showing the substrate and thermally conductive layers of FIG. 2 applied to the substrate and adhesive layers of FIG. 3, so as to form a prior art six layer thermal interface;

FIG. 4a is a cross-sectional side view of the prior art six layer thermal interface of FIG. 4, taken along lines 4a thereof;

FIG. 5 schematically illustrates a side view of a process for applying adhesive film to one side of a substrate and then for applying a paper backing to the adhesive film layer, according to the present invention;

FIG. 6 is an enlarged cross-sectional end view of the adhesive film coated substrate having a paper backing of FIG. 5, taken along lines 6 thereof;

FIG. 7 is a cross-sectional view of the adhesive coated substrate with paper backing of FIG. 6, showing a thermally conductive material applied to both surfaces thereof and showing the paper backing being peeled away;

FIG. 8 is a cross-sectional view of the three layer thermal interface of FIG. 7 showing the paper backing removed therefrom;

FIG. 9 is a perspective view of a heat sink positioned for attachment to an electronic component, showing a preformed thermal interface pad of the present invention disposed therebetween.

DETAILED DESCRIPTION OF THE PREFERRED EMBODIMENT

Figure 10:
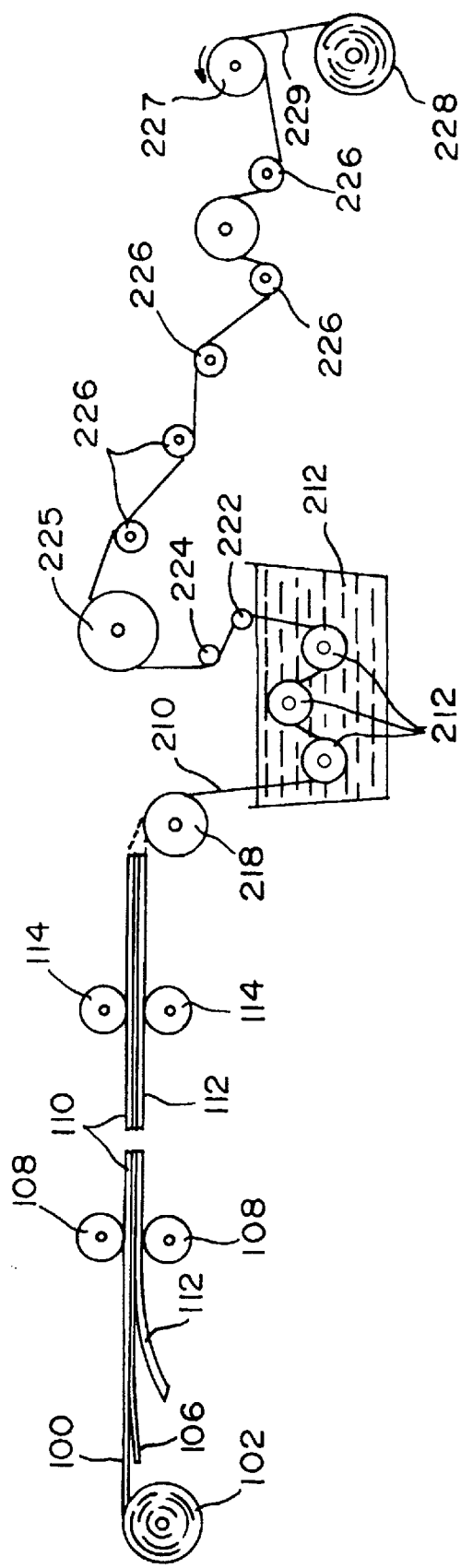
FIG. 10 is a schematic side view of the process for forming the adhesive thermal interface of the present invention.

The detailed description set forth below in connection with the appended drawings is intended as description of the presently preferred embodiment of the invention and is not intended to represent the only form in which the present invention may be constructed or utilized. The description sets forth the functions and the sequence of steps for constructing and operating the invention in connection with the illustrated embodiment. It is to be understood, however, that the same or equivalent functions and sequences may be accomplished by different embodiment that are also intended to be encompassed within the spirit and scope of the invention.

The thermal interface of the present invention is illustrated in FIGS. 5 through 10 which depict a method for forming the thermal interface. FIGS. 1 through 4a depict prior art thermal interfaces and methodology for forming the same.

Referring now to FIGS. 1–2a, a method for forming a simple prior art thermal interface comprising only a substrate and a layer of conformable heat conducting material formed upon either side thereof, is illustrated. According to the prior art, the substrate is typically comprised of either a polymer material such as KAPTON or mylar, or a metal such as aluminum. The conformable heat conducting material is comprised of a paraffin or petroleum jelly mixture or compound, having suitable solid fillers.

With particular reference to FIG. 1, the substrate 10 is drawn through a bath of liquid heat conducting material 12 to form the simple thermal interface 14. More particularly, the substrate 10 is deployed from a roll 16 thereof and travels over entry roller 18 prior to entering the bath of heat conducting material 12. The bath comprises a liquid or molten paraffin and petroleum jelly mixture. The heat conducting material is a material which remains substantially solid at room temperature and which becomes more fluid at the elevated temperature at which the electronic device operates.

Bath rollers 20 guide the substrate 10 through the bath 12. Calendar or coating rollers 22 and chill roller 23 cooperate with transport rollers 26 and take up roller 27 to form the thermal interface product. If desired, a layer of paper 25 is wound upon the take up roller 27, simultaneously with the thermal interface 14, such that the paper 25 is disposed intermediate adjacent layers of the thermal interface 14, thereby isolating adjacent layers of the thermal interface 14 from one another, so as to prevent sticking of the adjacent layers of thermal interface 14 to one another. The paper 25 is drawn from roll 28.

With particular reference to FIGS. 2 and 2a, the above described process results in the formation of a simple thermal interface 14 comprising only a polymer or metal substrate 10 and a conformable, heat conductive material 30 formed upon both sides thereof.

Referring now to FIGS. 3–4a, the simple prior art thermal interface described above may be enhanced to provide an adhesive layer 36 therefor. Such an adhesive layer 36 facilitates attachment of the resulting enhanced thermal interface 38 to either an electronic component or heat sink, as desired.

With particular reference to FIGS. 3 and 3a, such an adhesive layer 36 for the enhanced thermal interface 38

(FIGS. 4 and 4a) is preferably formed by coating a mylar substrate 40 upon both sides thereof with adhesive 36 and 37. This forms as adhesive coated substrate 42. Those skilled in the art will appreciate that various other materials are likewise suitable for use as a substrate. For example, the substrate may be comprised of polyethylene, polyester, etc.

With particular reference to FIGS. 4 and 4a, the adhesive coated substrate 42 of FIGS. 3 and 3a is then applied to the simple thermal interface 14 of FIGS. 2 and 2a to form the enhanced thermal interface 38 of the prior art. The adhesive layer 37 formed upon the lower surface of the substrate 40 facilitates attachment of the adhesive coated substrate 42 to the simple thermal interface 14.

However, as those skilled in the art will appreciate, such a relatively complex assembly—containing six discrete layers—is not configured for optimal heat transmission therethrough, and thus is not best suited for application as a thermal interface for facilitating heat transfer from an electronic component to a heat sink. It is well known that the rate of heat transfer through such an interface is reduced by each layer added thereto. It has been found that the use of six such layers undesirably reduces heat transfer.

The prior art enhanced thermal interface 38 thus comprises, from top to bottom, a first or external adhesive layer 36, a mylar substrate 40, a second or internal adhesive layer 37, a first or internal heat conductive layer 30, a KAPTON Type MT substrate 10, and a second or external heat conducting layer 31. As those skilled in the art will appreciate, various different durable sheet materials are suitable for use in place of the mylar substrate 40 and the KAPTON substrate 10.

Referring now to FIGS. 5–9, the present invention comprises a thermal interface having an adhesive layer so as to facilitate attachment thereof to either an electronic component or a heat sink. The thermal interface of the present invention, as installed, comprises only three layers, so as to enhance heat flow therethrough. As those skilled in the art will appreciate, heat flow through the three layer adhesive thermal interface of the present invention is substantially enhanced, as compared to heat flow through the six layer prior art adhesive thermal interface. Moreover, the overall thickness of the thermal interface of the present invention, as compared to the prior art, is substantially reduced, thereby even further enhancing heat flow therethrough.

With particular references to FIGS. 5 and 10, the thermal interface of the present invention is formed by deploying sheet KAPTON 100, preferably Type MT, from a roll 102 thereof and applying a layer of adhesive 106 to the second surface thereof. According to the preferred embodiment of the present invention, the layer of adhesive 106 comprises a sheet thereof which is applied to the KAPTON substrate 100 via rollers 108. As those skilled in the art will appreciate, various other means, i.e., spraying, dipping, etc., for applying adhesive to the KAPTON substrate 100 are likewise suitable. As those skilled in the art will further appreciate, the adhesive must be capable of withstanding the elevated temperatures encountered during processing, i.e., the temperature of the bath of heat conducting material, as well as the elevated temperature of the electronic component. The layer of adhesive 106 and/or paper liner 112 may optionally be pre-applied to the KAPTON substrate 100 at a separate location and/or during a separate process. Thus, the process illustrated in FIG. 10 below may be performed with a substrate having the adhesive layer 106 and/or the paper liner 112 already applied thereto, thus eliminating these steps.

The adhesive coated KAPTON substrate 110 next has a backing or paper liner 112 applied to the adhesive layer 106 thereof, preferably via rollers 114, to provide a paper backed, adhesive coated KAPTON substrate 116, as shown in FIG. 6.

The paper backed adhesive coated KAPTON substrate of FIG. 6 is then coated with the conformable, heat conducting material 212 in a similar manner, as illustrated in FIG. 10. This forms a first or upper layer 122 of heat conductive material upon the KAPTON substrate 100 and a second or lower layer 124 of heat conductive material upon the peel away paper backing 112. Some or substantially all of the lower layer 124 of heat conductive material may be removed from the peel away paper backing 112 via calendaring rollers 224. Coating the paper backed adhesive coated KAPTON substrate 100 of FIG. 6 with a layer of conformable, heat conducting material forms the thermal interface 120 of the present invention.

As particularly shown in FIG. 10, the paper backed adhesive coated KAPTON substrate 210 travels over entry roller 218 prior to entering the bath of heat conducting material 212. The bath comprises liquid or molten paraffin and petroleum jelly mixture. As stated earlier, the heat conducting material is a material which remains substantially solid at room temperature and which becomes fluid at the elevated temperature at which the electronic device operates.

Bath rollers 220 guide the paper backed adhesive coated KAPTON substrate 210 through the bath 212. Calendar roller 222 removes excess heat conducting material from the substrate to yield a desired thickness of heat conductive material thereon. Calendar roller 224 preferably removes substantially all of the heat conducting material applied to the paper backed adhesive coated KAPTON substrate 210. Chill roller 225 functions to allow the heat conducting material to cool and assume a generally solid state. Further, transport of the paper backed adhesive coated KAPTON substrate is facilitated via take-up roller 227 and guide rollers 226 in a manner previously described. Further, an optional paper liner 229 may be applied via roll 228 to prevent sticking of adjacent layers of the thermal interface upon take-up roller 227.

The thermal interface 120 of the present invention is preferably stored and handled with the paper backing 112 in place, so as to avoid soiling or contamination of the adhesive layer 106 covered thereby. The paper backing 112 can be peeled away from the thermal interface 120 (as shown in FIG. 7) so as to expose the adhesive layer 106, thereby facilitating attachment of the thermal interface 123 to either an electronic component or heat sink (FIG. 9), as desired.

With particular reference to FIG. 9, in use the thermal interface of the present invention is applied to either an electronic component 152 or a heat sink 150 by removing the peel away paper backing 112 (as shown in FIG. 7). Removal of the paper backing 112 exposes the clean adhesive layer 106 disposed therebeneath.

The thermal interface of the present invention is preferably die-cut so as to conform to the surface pattern or footprint of the electronic component 152 or heat sink 150 to which it is to be attached. Alternatively, a desired shape can be manually cut from a sheet of thermal interface, so as to provide a custom fit.

Light to moderate pressure is applied to the thermal interface so as to assure reliable attachment thereof to the electronic component or heat sink to which it is being attached. The electronic component or heat sink may then be stored, transported, sold, or attached to its matching component, i.e., a complimentary heat sink or electronic component whereby final assembly of the heat sink and/or electronic component typically involves attachment to the corresponding component via mechanical means, i.e., clips, clamps, and/or various other mechanical fasteners.

At room temperature, i.e., when the electronic device is not operating, the heat conductive layer 122 remains substantially solid. At room temperature, the paraffin, petroleum jelly mixture, or the like is preferably substantially solid and feels generally dry to the touch. In this state, the heat conductive layer 122 conforms somewhat to the shapes of the surfaces of the electronic component 152 and/or heat sink 150. When the electronic component 152 is at operating temperature, the heat conducting layer 122 melts or flows so as to assure that voids between the electronic component 152 and the heat sink 150 are filled, thereby maintaining a generally continuous path for heat transfer from the electronic component 152 to the heat sink 150. When the electronic component 152 returns to room temperature, the heat conductive layer 122 preferably re-solidifies.

For use on electronic components and/or heat sinks having especially irregular surfaces, such as is common with microprocessor chips, the thickness of the heat conductive layer 122 can be increased, e.g., doubled, so as to assure that air gaps or voids are eliminated.

The adhesive thermal interface of the present invention represents a desirable compromise between ease of assembly and heat transfer. As discussed in detail above, each additional layer reduces the interface's ability to transfer heat from the electronic component to the heat sink. However, ease of assembly is attained via the addition of the adhesive layer. It has been found that the adhesive thermal interface of the present invention provides adequate heat transfer while also facilitating easy application thereof.

As mentioned above, clips, clamps, fasteners, or other mechanical devices are preferably utilized to attach the heat sink 150 to the electronic component 152. The thermal interface 122 of the present invention preferably only comprises an adhesive layer formed upon one surface thereof. The opposite surface preferably comprises the heat conducting material 122. Thus, an effective and easy to apply thermal interface is provided by the present invention.

Use of the present invention makes it easier to obtain desired registration between a thermal interface and the electronic component and/or heat sink. By applying the adhesive thermal interface to either the electronic component or the heat sink, its position thereupon is maintained via the adhesive, so as to prevent mis-registration during installation of the heat sink to the component.

The adhesive thermal interface of the present invention may be die cut, punched, roll cut, or otherwise cut or shaped so as to conform to the desired shape or footprint, so as to provide maximum heat transfer from the electronic component to the heat sink. Those skilled in the art will appreciate that various other different cutting and/or shaping processes are likewise suitable.

It is understood that the exemplary thermal interface described herein and shown in the drawings represents only a presently preferred embodiment of the present invention. Indeed, various modifications and additions may be made to such embodiment without departing from the spirit and scope of the invention. For example, the peel away substrate may be comprised of various different flexible sheet materials such as polymer, metal foil, etc. Also, those skilled in the art will appreciate that various processes are suitable for applying the adhesive to the KAPTON substrate, as well as for applying the heat conductive material to the thermal interface.

What is claimed is:

1. A method for forming a thermal interface for facilitating heat transfer from an electronic component to a heat sink, said method comprising the steps of:

a) providing a generally planar substrate formed from thermally conductive material, said generally planar substrate being interposable between said electronic component and said heat sink;

b) forming a layer of conformable heat conducting material upon a first surface of said generally planar substrate;

c) forming a layer of adhesive upon a second surface of said substrate; and d) wherein said layer of adhesive formed upon the second surface of said substrate facilitates attachment of the thermal interface to one of the electronic component and the heat sink, and wherein said layer of conformable heat conducting material deforms to enhance heat transfer from the electronic component to the heat sink when said substrate is interposed therebetween.

2. The method as recited in claim 1 wherein said substrate comprises a polymer.

3. The method as recited in claim 2 wherein said substrate comprises KAPTON Type MT.

4. The method as recited in claim 1 wherein said substrate comprises a thermally conductive metal foil.

5. The method as recited in claim 4 wherein said substrate comprises at least one of aluminum alloy, copper, silver, and gold.

6. The method as recited in claim 1 wherein said layer of conformable heat conducting material comprises at least one of paraffin and petroleum jelly.

7. The method as recited in claim 1 wherein said layer of conformable heat conducting material comprises paraffin and a material to enhance heat conduction therethrough.

8. The method as recited in claim 1 wherein said layer of conformable heat conducting material comprises a material which is generally solid at room temperature and which is generally fluid at an operational temperature of said electronic component.

9. A method for forming a thermal interface for facilitating heat transfer from an electronic component to a heat sink, said method comprising the steps of:

a) providing a generally planar substrate formed from thermally conductive material, said generally planar substrate being interposable between said electronic component and said heat sink;

b) forming a layer of adhesive upon a second surface of said generally planar substrate;

c) applying a peel away protective layer to the layer of adhesive on the second side of the substrate; and d) forming a layer of conformable heat conducting material upon the layer of adhesive on the first side of the substrate by immersing the substrate in bath of liquid conformable heat conducting material.

10. A method for forming a thermal interface for facilitating heat transfer from an electronic component to a heat sink, said method comprising the steps of:

a) dispensing sheet KAPTON Type MT from a roll thereof, said sheet KAPTON having first and second surfaces thereof, said sheet KAPTON being interposable between said electronic component and said heat sink;

b) laminating the second surface of the sheet KAPTON with sheet adhesive film;

c) laminating the second surface of the sheet KAPTON with peel away protective paper; and d) forming a layer of paraffin upon the first surface of the sheet KAPTON by immersing the sheet KAPTON in a bath of liquid paraffin, the liquid paraffin comprising a material to enhance heat conduction therethrough.

* * * * *